United States Patent
Herbst et al.

(10) Patent No.: US 11,901,730 B2
(45) Date of Patent: Feb. 13, 2024

(54) GRID IMPEDENCE ESTIMATION FOR POWER CONVERTER CONTROLLER

(71) Applicant: Siemens Aktiengesellschaft, Munich (DE)

(72) Inventors: Gernot Herbst, Chemnitz (DE); Daniel Kloeser, Eckernförde (DE); Xiaofan Wu, North Brunswick, NJ (US); Ulrich Muenz, Princeton, NJ (US)

(73) Assignee: Siemens Aktiengesellschaft, Munich (DE)

( * ) Notice: Subject to any disclaimer, the term of this patent is extended or adjusted under 35 U.S.C. 154(b) by 445 days.

(21) Appl. No.: 17/262,776

(22) PCT Filed: Aug. 20, 2018

(86) PCT No.: PCT/US2018/047076
§ 371 (c)(1),
(2) Date: Jan. 25, 2021

(87) PCT Pub. No.: WO2020/040724
PCT Pub. Date: Feb. 27, 2020

(65) Prior Publication Data
US 2021/0313833 A1 Oct. 7, 2021

(51) Int. Cl.
*H02J 13/00* (2006.01)
*G01R 27/16* (2006.01)

(52) U.S. Cl.
CPC ........ *H02J 13/00002* (2020.01); *G01R 27/16* (2013.01); *H02J 2203/20* (2020.01)

(58) Field of Classification Search
None
See application file for complete search history.

(56) References Cited

U.S. PATENT DOCUMENTS

| | | | |
|---|---|---|---|
| 5,574,356 A | 11/1996 | Parker | |
| 2012/0280673 A1 | 11/2012 | Watanabe et al. | |
| 2012/0306515 A1* | 12/2012 | Barnes | G01R 27/16 324/707 |
| 2013/0128393 A1 | 5/2013 | Gajic | |
| 2013/0148394 A1 | 6/2013 | O'Brien et al. | |
| 2016/0134114 A1 | 5/2016 | Gupta et al. | |

OTHER PUBLICATIONS

PCT International Search Report dated Oct. 19, 2018; International Application No. PCT/US2018/047076; 12 pages.

* cited by examiner

*Primary Examiner* — Jas A Sanghera

(57) ABSTRACT

A system and method for estimation of grid impedance in a power converter controller is disclosed in which a current controller is provided to inject an injection current while operating online and coupled to a power grid at a point of common coupling (PCC), the injection current being benign to an operating current of the power converter. A voltage controller is provided to regulate input voltage of the power converter. An impedance module is provided to determine parameters for the injection current, including injection interval and duration, current magnitude, current frequency, and symmetrical components. The impedance module may extract measurements of current and voltage at the PCC at an operating point shifted from a previous operating point in response to the injection current. The impedance module may extract symmetrical components of current and voltage measurements, and compute estimated grid impedance based on the extracted symmetrical components.

15 Claims, 7 Drawing Sheets

GRID IMPEDENCE ESTIMATION FOR POWER CONVERTER CONTROLLER

TECHNICAL FIELD

This application relates to power grids. More particularly, this application relates to power grid impedance estimation by a power converter controller used at a power grid connection point.

BACKGROUND

Power generation systems, such as solar arrays and wind farms, require means for converting AC or DC power produced by the generation system, to a regulated AC power delivery according to compatibility constraints with respect to a connected power grid. For example, regulatory bodies may institute regulations that require the power converter to maintain active and reactive power response under grid disturbances, active power control and frequency regulation, and reactive power control and voltage regulation. The power converter may include inverters and filters to convert DC voltage to a three phase AC voltage tuned to the voltage and frequency of the power grid. The power converter controller may include a current controller used to maintain operation set points for voltage regulation. The current controller requires an accurate estimation of reactive grid impedance in real time to control parameters, such as converter gain.

Power control analyses for three phase power system components (e.g., transformers, generators, protective relays) commonly apply a model to represent the unbalanced phases, which consists of three symmetrical components: positive sequence, negative sequence, and zero sequence. Briefly, the model is useful in that the asymmetrical three phase parameter is equivalent to the sum of the positive sequence, negative sequence and zero sequence, each of which being symmetrical, independent and thus more tractable. Active grid impedance estimation methods inject forced disturbances or signals to the grid in parallel to the regular operation of the power converter. Active current injections can induce an unbalanced phase condition to which the symmetrical component analysis can be relevant. However, active current injection methods are usually intrusive and require certain systematic perturbation to be injected in order to extract information needed in the estimation process. Such active methods disrupt the active profile of the system, which interferes with operation of power converter set points and may be noncompliant with grid compliance codes.

Hence, problems to overcome for converter controllers include preservation of the active power profile, and robust operation that is adaptive to uncertain, time-variant grid impedance for improved control performance to allow fast reaction to small operation point changes with accurate grid impedance estimation. The estimation of grid impedance must be identified during online operation of the converter.

SUMMARY

Aspects according to embodiments of the present disclosure include a system and method for estimation of grid impedance in a power converter controller. The system may include a processor for executing program modules of a system memory having at least the following program modules. A current controller is configured to inject an injection current while operating online and coupled to a power grid at a point of common coupling (PCC), the injection current being benign to an operating current of the power converter. A voltage controller is configured to regulate input voltage of the power converter. An impedance module is configured to determine parameters for the injection current, including injection interval and duration, current magnitude, current frequency, and symmetrical components. The impedance module may extract measurements of current and voltage at the PCC at an operating point shifted from a previous operating point in response to the injection current. The impedance module may extract symmetrical components of current and voltage measurements, and compute estimated grid impedance based on the extracted symmetrical components.

BRIEF DESCRIPTION OF THE DRAWINGS

Non-limiting and non-exhaustive embodiments of the present embodiments are described with reference to the following FIGURES, wherein like reference numerals refer to like elements throughout the drawings unless otherwise specified.

DETAILED DESCRIPTION

Figure 1:
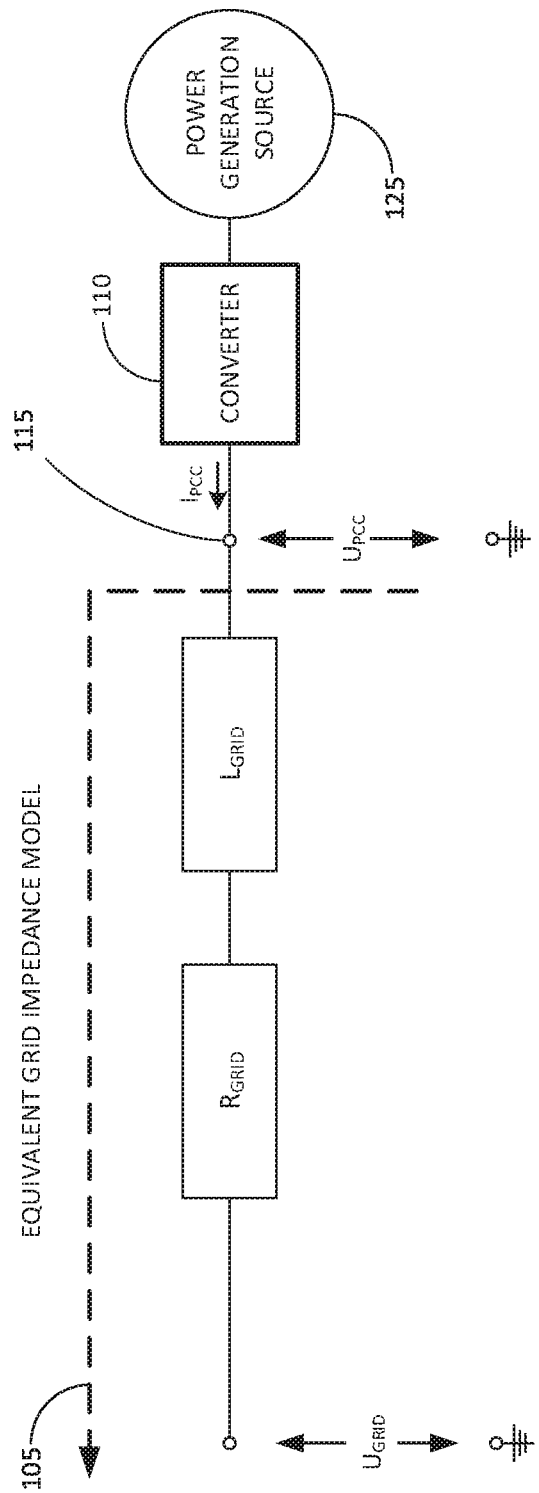
FIG. 1 shows a diagram of an example for modeling equivalent impedance for a power grid.

FIG. 1 shows a diagram of an example for modeling equivalent impedance for a power grid. An equivalent grid impedance model 105 includes an active impedance $R_{GRID}$ and a reactive impedance $L_{GRID}$ as seen by the point of common coupling (PCC) 115 for a power converter 110 used to regulate voltage from a power generation source 125. Measurement or calculation of voltage $U_{PCC}$ and current $I_{PCC}$ values at the PCC 115 can be used to estimate the impedance values $R_{GRID}$ and $L_{GRID}$.

Figure 2:
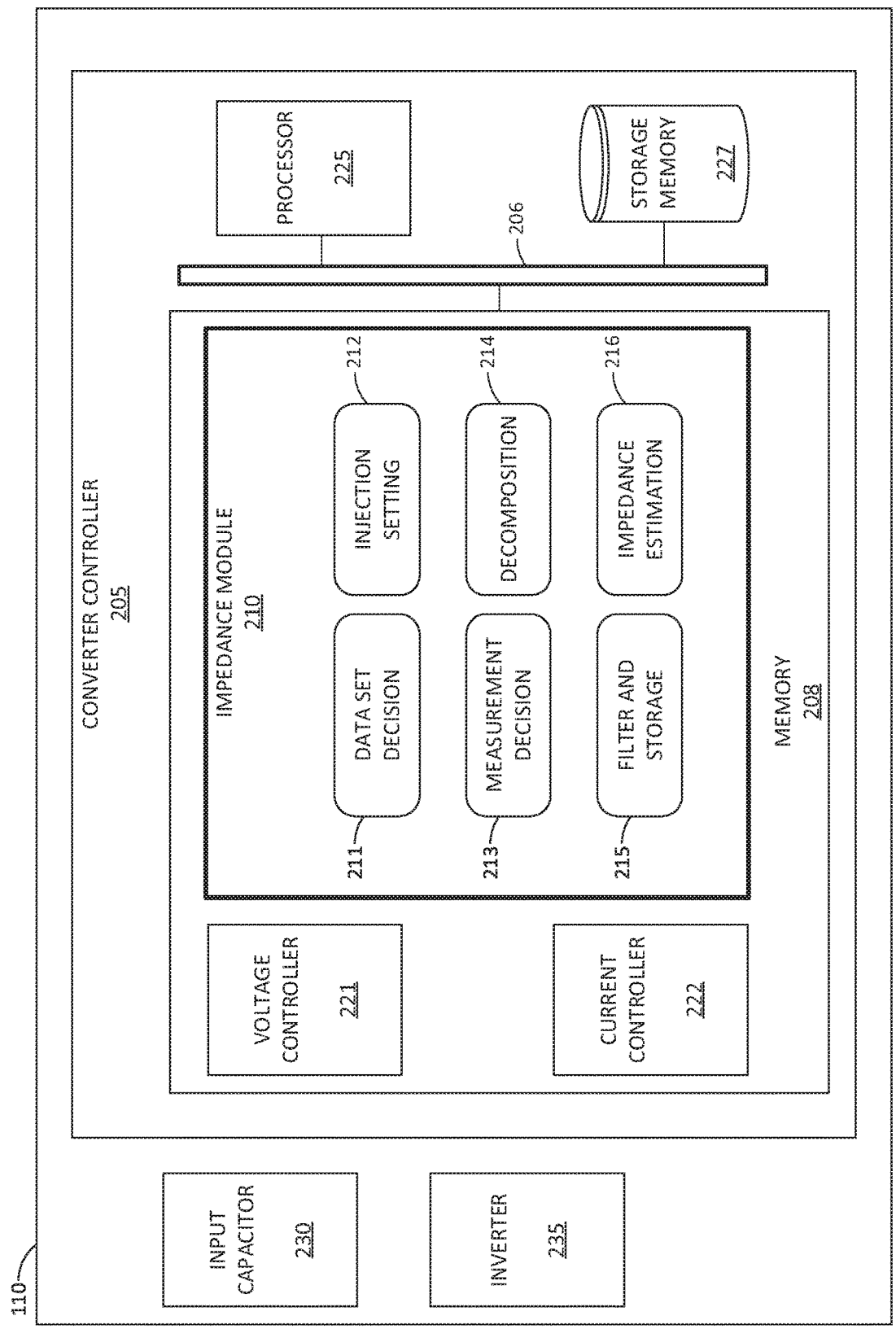
FIG. 2 shows a block diagram of an example for algorithmic structure of a converter controller in accordance with embodiments of the disclosure.

FIG. 2 shows a block diagram of an example for algorithmic structure of a converter controller in accordance with embodiments of the disclosure. A converter, such as converter 110 shown in FIG. 1, may include a converter controller 205 configured to control regulation of voltage, current and frequency of power delivered to the power grid at the PCC 115. Frequency control may be controlled according to frequency given by the grid. Converter controller 205 may include a processor 225 to execute modular algorithms stored in memory 208, such as a voltage controller 221, a current controller 222, and impedance module 210. An input capacitor 230 may be used to regulate the DC voltage from the power generation source 125 (e.g. a photo voltaic (PV) array voltage). The voltage of capacitor 230 may be controlled by the voltage controller 221 which monitors capacitor voltage and sends control commands to current controller 222 for adjustment to current regulation set point, which controls desired current flow to the grid. For example, the voltage controller may monitor the voltage of capacitor 230 and send a control command signal to current controller 222, in order to maintain the capacitor voltage within an acceptable range. The inverter 235 may include switching devices, such as MOSFETs, to invert input DC voltage to three phase AC voltage. The gain g for current controller 222 may be controlled to ensure stable operation of the current controller 222 such that a clean sinusoidal output voltage for inverter 235 is generated. For example, the driving voltage for the switching devices should not fall below a minimum threshold. During online operation of the converter 110, current controller 222 supplies a positive sequence output to operate the inverter 235. Injection of positive sequence current of a common frequency to alter operating points for grid impedance estimation would introduce a disturbance to the balanced control of the inverter 235. As a solution to this technical problem, the embodiments of the present disclosure propose injection of current that is benign to the operating current $I_{OP}$.

The parameters (e.g., gain and time constants) for current controller 222 may be adjusted according to grid impedance. Therefore an accurate estimation of grid inductive impedance $L_{GRID}$ is required. The parameter adjustments are continuously performed in response to detected changes to the grid impedance over time. To estimate the grid impedance, the impedance module 210 may execute various algorithmic modules, including data decision module 211, injection setting module 212, measurement decision module 213, decomposition module 214, filter and storage module 215, and impedance estimation module 216. Briefly, the impedance module 210 may extract multiple measurements (e.g., voltage and current) at different operating points, which change in response to current injections by the current controller 222. The current injections are of a composition that is benign to the operating current $I_{OP}$ For example, the benign current injections may be negative sequence current, which has negligible effect on the positive sequence current for operating the inverter 235. Alternatively, the benign current injections may be a positive sequence current at a harmonic frequency relative to the frequency of operating current $I_{OP}$, which would have negligible effect on the positive sequence operating current $I_{OP}$. As another alternative example, the benign current injections may be a negative sequence current at a harmonic frequency. For each operating point shifted by a benign current injection, measurements may be performed and then decomposed for analysis of symmetric components to calculate the estimated grid impedance.

Figure 3:
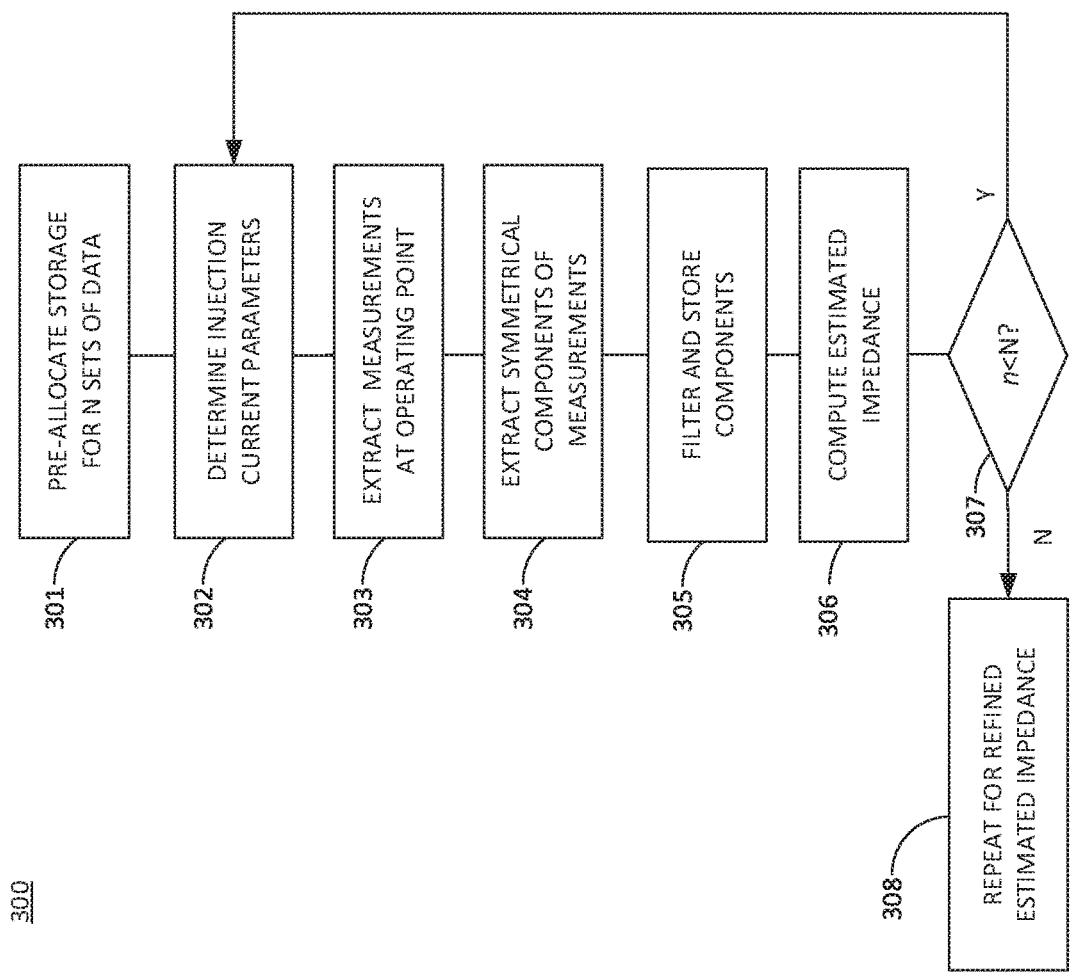
FIG. 3 shows a flowchart for an example of a method to estimate grid impedance in accordance with one or more embodiments of the disclosure.

FIG. 3 shows a flowchart for an example of a method to estimate grid impedance in accordance with one or more embodiments of the disclosure. The steps of method 300 are described with reference to the corresponding algorithm modules shown FIG. 2.

At 301, the data set decision module 211 may pre-allocate memory addresses for N sets of data for storage in storage memory 230, where N corresponds to operating points. For example, data set decision module 211 may set N=3 in an embodiment that generates three sets of negative sequence power components, and may assign memory addresses accordingly.

At 302, the injection setting module 212 may determine the parameters of a benign current component $I_{INJ}$ (i.e., harmonic positive sequence current, or negative sequence current) to be injected from the current controller 222, in addition to the operating current $I_{OP}$, to produce total inverter output current for the inverter 235. In an embodiment, injection setting module 212 may set the magnitude for each phase of the current injection $I_{INJ}$, and may set a short duration for the injection interval t, (e.g., t<1 s), in such a manner to produce a small negative sequence phase shift in the output current for the inverter 235, enough to shift the operating point for measurement of current $I_{PCC}$ to determine grid impedance estimation. For example, the magnitude of the benign current component $|I_{INJ}|$ may be set between 5% and 15%, or at about 10% of the magnitude of operating current $I_{OP}$. Other ranges for setting the magnitude of the benign current component $|I_{INJ}|$ may be selected such that $|I_{INJ}| \ll I_{OP}$. In another embodiment, injection setting module 212 may set the magnitude for each phase of the current injection, and may set a short duration for the injection interval t, (e.g., t<1 s), in such a manner to produce a positive or a negative sequence phase shift in the current output for the inverter 235 at a harmonic frequency of operating current $I_{OP}$ (e.g., third or fifth order harmonics). During the benign current injection, power grid impedance and voltage phasor remain constant, in contrast with conventional methods which actively inject positive sequence current components to induce operating point shifts.

In response to the benign injection current, the measurement decision module 213 may extract measurements required for grid impedance estimation at an operating point shift following an appropriate settlement period at 303. For example, the grid impedance may react to the injection based on grid inductance, and measured voltage $U_{PCC}$ and current values $I_{PCC}$ at the PCC will experience a transient period before settling to a new steady state value, which will be treated as a designated operating point shifted from the previous operating point. In an embodiment, the measurement decision module 213 may read transient current measurements to determine an appropriate time instance for the operating point after the transients have settled, and then trigger the required measurements, or may perform an instantaneous reading of continuously available measurements at the operating point. The measurements taken are dependent upon the available measuring capabilities of the converter controller 205, which may include sensors at the PCC to measure voltage and current magnitude, voltage and current phasors, active and reactive power, or a combination thereof. In another embodiment, a fixed delay may be set by the measurement decision module 213 to allow for transient decay. Following the settlement period, measurement decision module 213 may record the required measurements. For example, using a UPQ approach, the required measurements are magnitude measurements of voltage $U_{PCC}$, active power $P_{PCC}$, and reactive power $Q_{PCC}$. As another example that uses a UI approach, the required measurements are phasor measurements of voltage $U_{PCC}$ and current $I_{PCC}$. The measured values correspond to the shifted operating point for the converter controller 205.

The decomposition module 214 may extract negative sequence symmetrical components of the measurements at 304 by an inverse Park transformation in a vector-based analysis in a DQ reference frame. For example, in the case where negative sequence injection is applied, an inverse Park transformation may be performed with a negative nominal frequency $-f_o$ (e.g., $-f_o=-60$ Hz as a correspondence to the US standard, $-f_o=-50$ Hz as a correspondence to the European standard). As another example when H order harmonic positive sequence current injection is applied as the benign current component $I_{INJ}$, a non-negative Park transformation may be performed with $Hf_0$, where H is an odd integer greater than 1. The extracted symmetrical components correspond to the shifted operating point of the converter controller 205.

The filter and storage module 215 at 305 may pass the extracted symmetrical components through a series of low-pass filters and a notch filter to remove oscillations with twice the fundamental frequency, $2f_o$. The filtered components may then be stored in storage memory 230 at the pre-allocated addresses. For example, in a UPQ approach with negative sequence current injection, the filtered negative sequence components of the magnitude measurements of voltage U, active power P, and reactive power Q may be stored as data corresponding to the shifted operating point.

At 306, the impedance estimation module 216 uses the filtered components to calculate an explicit solution for the estimated grid impedance online.

At 307, a sequence counter may be incremented such that steps 302 to 306 are repeated until at least N operating points have been analyzed. For example, in a UPQ approach, the sequence may require at least N=3 operating points, and in a UI approach, the sequence may require at least N=2 operating points.

At 308, impedance estimation module 216 may refine the results for impedance estimation by additional repetitions of steps 302 to 306 by providing analysis for additional operating points for n>N, for an improved solution in the estimation of grid impedance.

For a converter controller 205 that records measurements using an UPQ approach, the impedance estimation module 216 may solve load flow equations that are combined for the equivalent model of the grid for all N operation points. The resulting nonlinear least square optimization problem aims to solve the following equation:

$$(R, |U_{GRID}|) = |U_{PCC}|^2 - |U_{GRID}|^2 + [(R^2 + X^2)(P^2 + Q^2)] / [9|U_{PCC}|^2] - [\tfrac{2}{3}(R*P + X*Q)] \quad \text{Eq. (1)}$$

where
$U_{GRID}$ represents grid voltage
$U_{PCC}$ represents voltage measurements at PCC
R, X represent the real and imaginary part of the grid impedance, respectively
P, Q represent the active and reactive power measured at PCC, respectively.

Solution of Equation (1) can be solved explicitly using the following steps.
1a) The above objective function Equation (1) may be simplified, where n is the operating point index. The element $U_{GRID}$ may be eliminated by subtracting equation pairs (n=1,2) and (n=1,3). Each difference equation may be simplified into an equation that describes a circle, yielding first circle equation and second circle equation, which can be represented as $(x-a)^2+(y-b)^2=r^2$, with radius r and each (x,y) a point on a circle with center point (a,b).
1b) Subtracting the circle equations gives a linear equation.
1c) Substitute the linear equation result of (1b) into Equation (1) for n=1, and solve the quadratic equation with one unknown.
1d) The result of (1c) may be substituted back into the linear equation of 1b.

The explicit solution to (1a) is (1b) and (1c) for N=3. Alternatively, (1a) can be solved numerically (i.e., without explicit solutions) for more than N=3 operation points. The advantage of the explicit solution (1b), (1c) is that it can be easily implemented for an online solution.

For a converter controller 205 that records measurements using an UI approach, the impedance estimation module 216 may compute explicit solutions for the following equations. Using Ohm's law, the following equations may be formulated for two different operating points n:

$$UPCC = Z * I_{PCC} + U_{GRID,n}; n=1,2 \quad \text{Eq. (2)}$$

where
$U_{GRID}$ represents the grid voltage
$U_{PCC}$, represent voltage and current measurements at PCC.

Solution of Equation (2) can be solved explicitly using the following steps.
(2a) Subtract the two equations for n=1 and n=2 and compute Z according to the following equation:

$$Z = [U_{PCC,2} - U_{PCC,1}] / [I_{PCC,2} - I_{PCC,1}] \quad \text{Eq. (3)}$$

(2b) R and X can be computed as follows:

$$R = Re\{Z\} \quad \text{Eq. (4)}$$

$$X = IM\{Z\} \quad \text{Eq. (5)}$$

Figure 4:
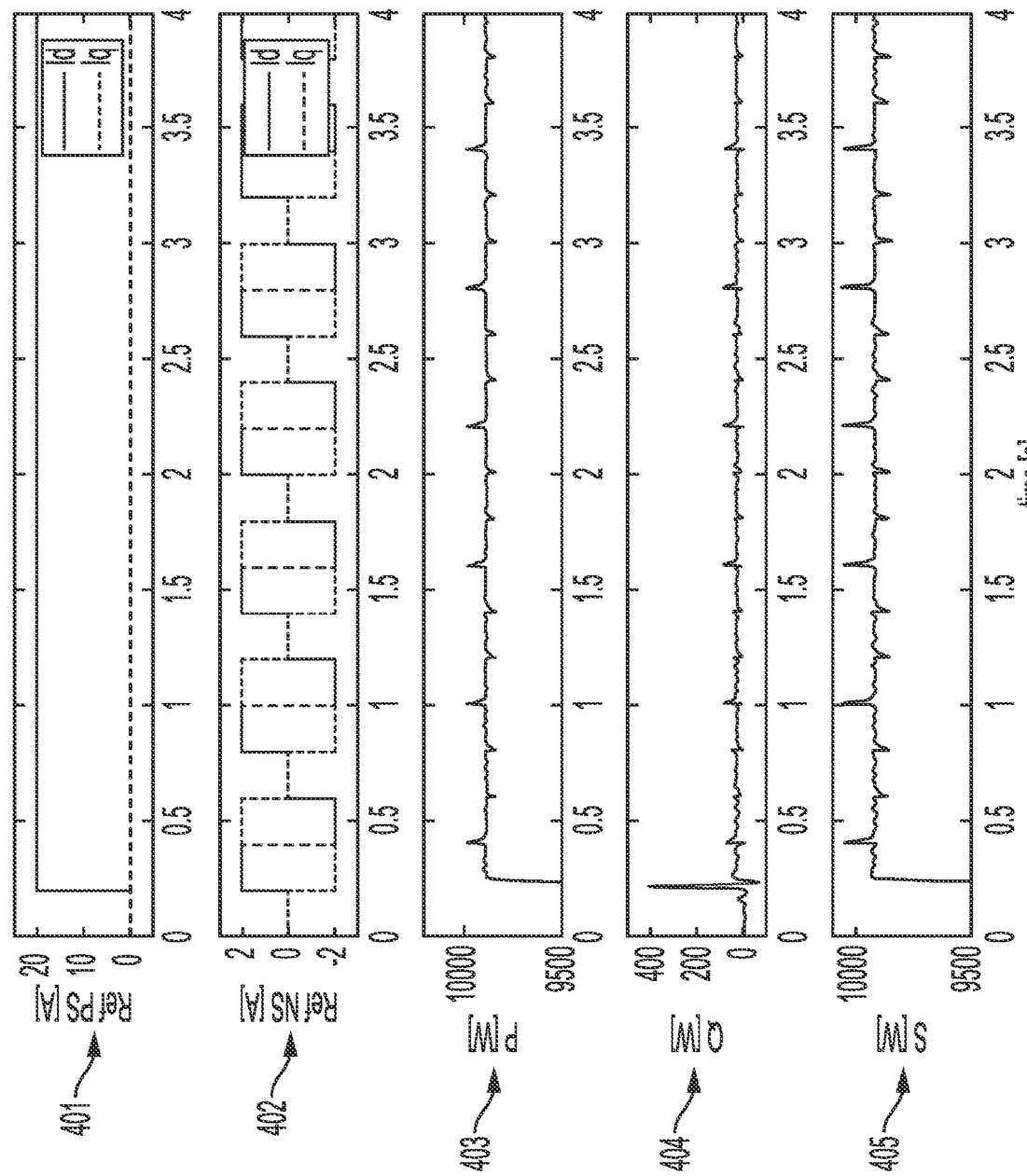
FIG. 4 illustrates a simulation that demonstrates the negligible effect of a benign current injection on power delivery in accordance with one or more embodiments of the disclosure.

FIG. 4 illustrates a simulation that demonstrates the negligible effect of a benign current injection on power delivery in accordance with one or more embodiments. A DC positive sequence current (Id=20 A, Iq=0) is output by current controller to control the inverter at 401. To induce the operating point shifts, a negative sequence current as shown in graph 402, where Id and Iq are phase switched every 0.2 seconds with alternating magnitude ±2 A, with the injection duration at about 0.2 seconds. The output power is shown by graphs 403, 404, 405 for active power P, reactive power Q and apparent power S, respectively, where variations in active power P are minimal (roughly ±1.0%).

Figure 5:
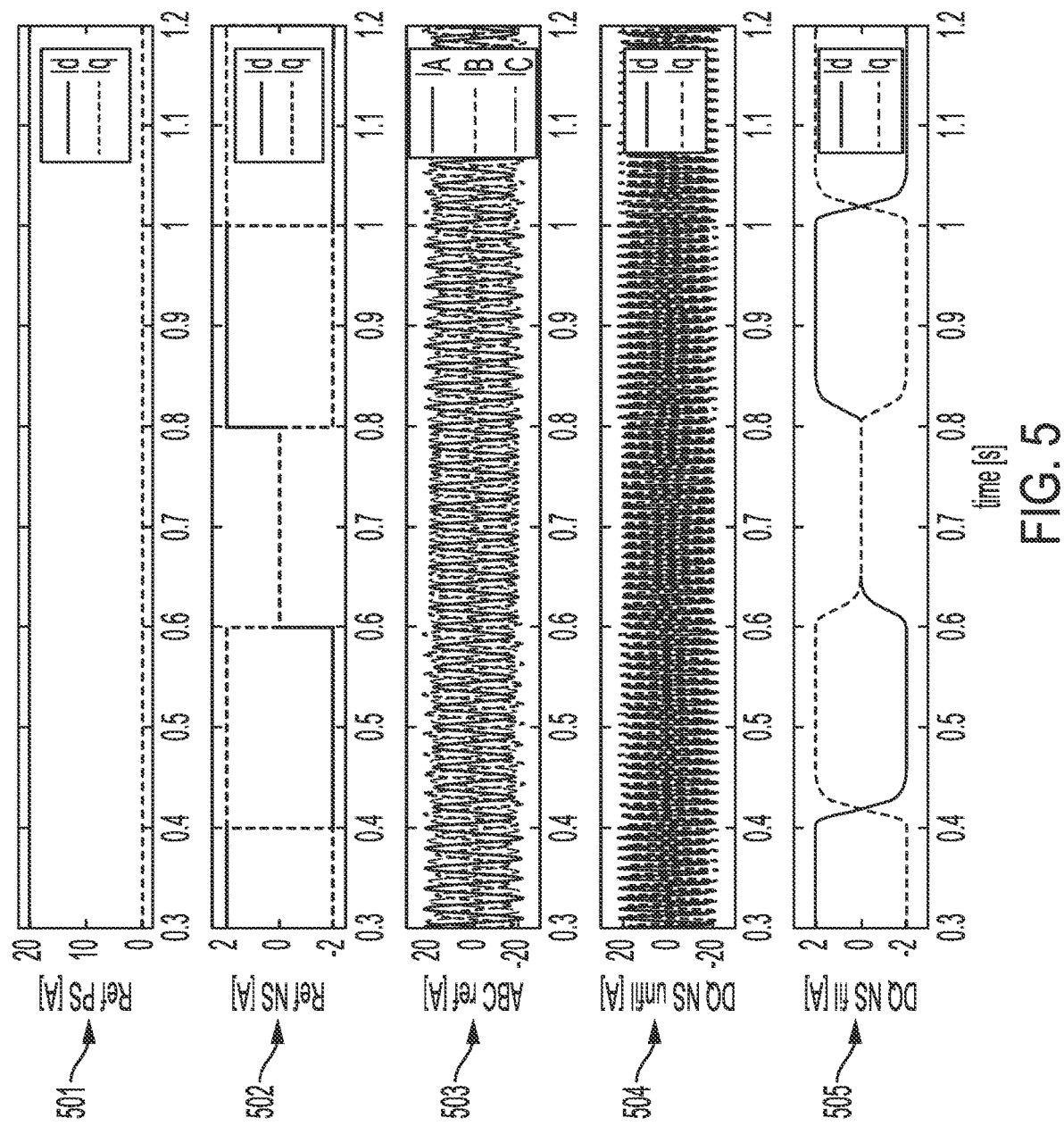
FIG. 5 illustrates a simulation that demonstrates the filtering of the decomposed components in accordance with embodiments of the disclosure.

FIG. 5 illustrates a simulation that demonstrates the filtering of the decomposed components in accordance with embodiments of the disclosure. Graph 501 shows DC positive sequence current (Id=20 A, Iq=0) is output by current controller to control the inverter, for an example in which the inverter is running at 20 A operating current $I_{OP}$. In graph 502, negative sequence current is injected as shown by Id and being phase switched every 0.2 seconds with alternating magnitude ±2 A. The resultant output current of the converter by the sum of the operating current of 501 and injection current of 502 after inverter switching is shown as the three phase AC current in graph 503. The d-axis and q-axis currents at the PCC (Id and Iq), shown in graph 504 are extracted by inverse Park transformation of measured currents shown in graph 503. Following the low pass and notch filtering by filter and storage module 215, a resultant negative sequence current is extracted as shown in graph 505. The grid resistance $R_{GRID}$ may be calculated from variation in d-axis current Id. The grid inductance $L_{GRID}$ may be computed from voltage difference caused by variation in q-axis current Iq.

Figure 6:
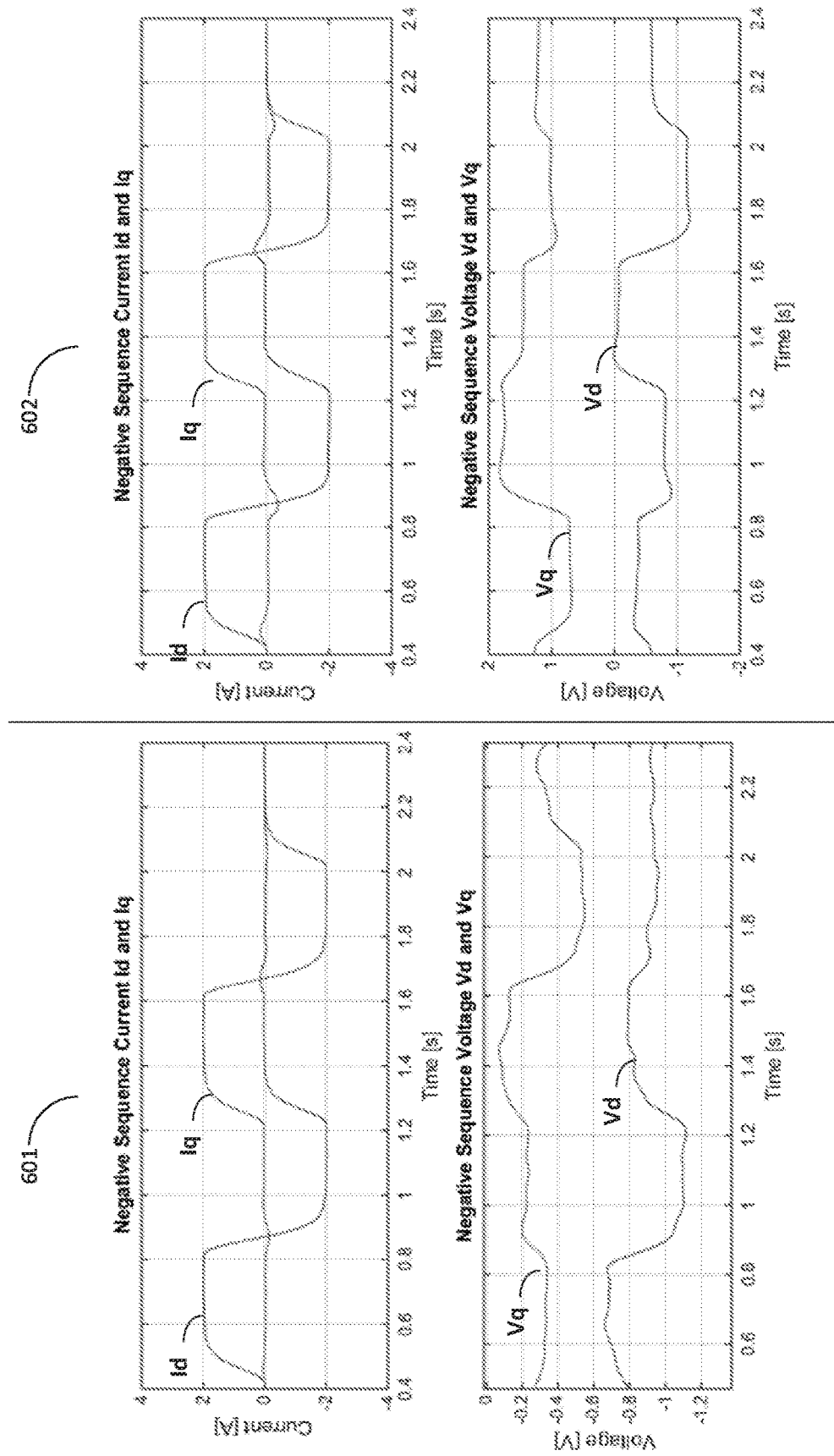
FIG. 6 illustrates a simulation that demonstrates fast response of impedance estimation in accordance with embodiments of the disclosure.

FIG. 6 illustrates a simulation that demonstrates fast response of impedance estimation in accordance with embodiments of the disclosure. In graphs 601, negative sequence voltage Vd and Vq are derived from voltage difference caused by variation in current Id and Iq. In graphs 602, an inductance differential was imposed using a hardware implementation where dL >600 uH to simulate a grid impedance change, and the impedance module 210 estimated a grid inductance of 850 uH with results averaged over previous 100 ms of each steady state.

Figure 7:
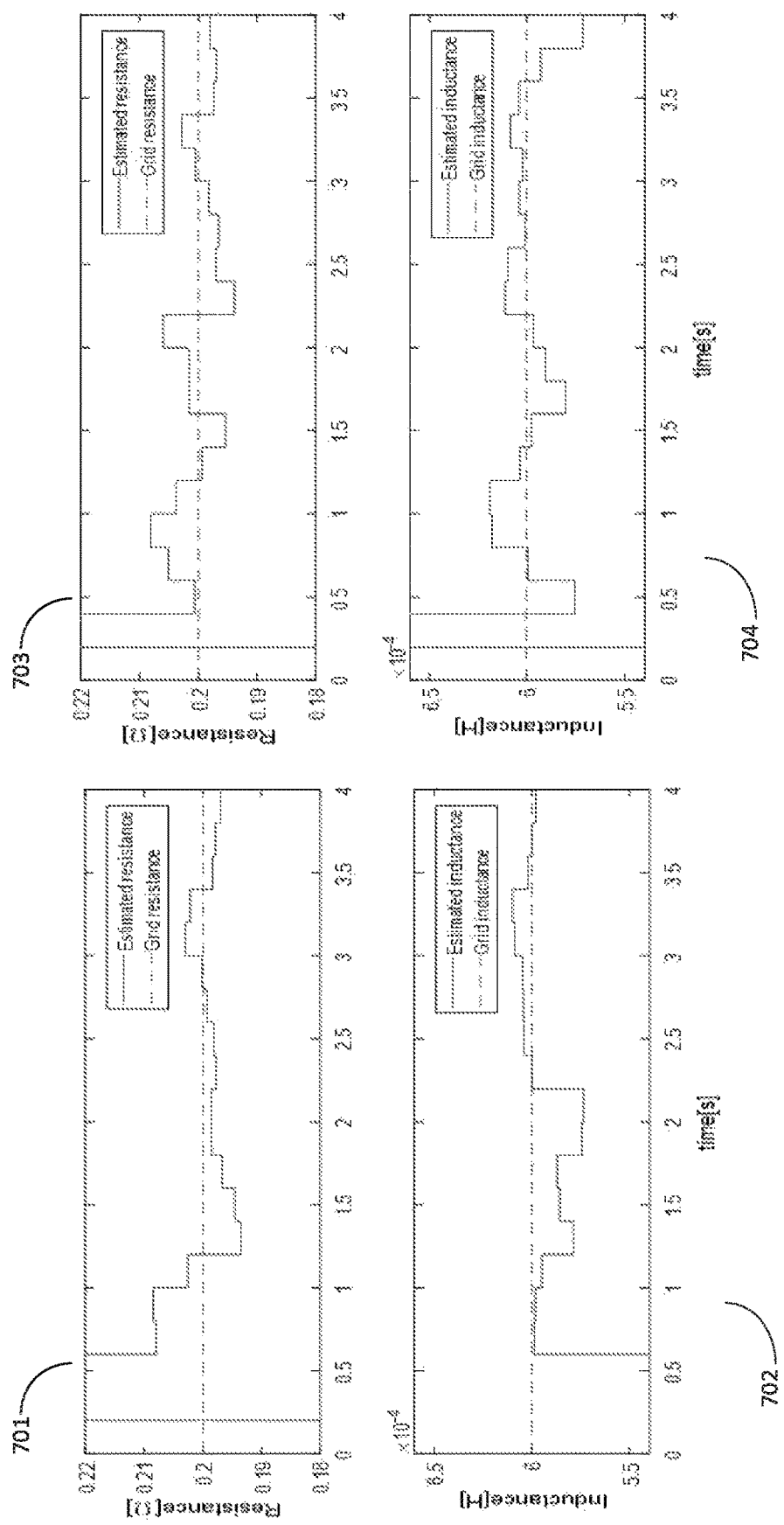
FIG. 7 illustrates impedance estimation results by simulation in accordance with embodiments of the disclosure

FIG. 7 illustrates impedance estimation results by simulation in accordance with embodiments of the disclosure. Estimation results for grid impedance using the UPQ approach produce graph 701 for grid resistance $R_{GRID}$ and produce graph 702 for grid inductance $L_{GRID}$. Operating point intervals of 0.2 seconds, beginning at t=0, are shown. The estimation value error relative to the actual values dissipates after three operating points as shown for graphs 701, 702. Similarly, grid impedance estimation using the UI approach is shown in graph 703 for grid resistance $R_{GRID}$ and graph 704 for grid inductance $L_{GRID}$ with operating point intervals of 0.2 seconds, beginning at t=0. Results may be summarized by an achievement of impedance estimation with <5% error in less than 1 second. For example, with injection current duration set at 0.2 seconds, and using two or three operating points for UI or UPQ approaches, respectively, the settlement times for the algorithms are achievable within 0.4 or 0.6 seconds, respectively.

Methods and systems of the present disclosure produce faster and accurate estimation of grid impedance (e.g., in less than 1 second) with small operation point changes for higher converter control performance. Settling time is improved by smaller operation point changes in terms of low current magnitude shifts. The benign current injection has negligible influence on delivered power components P and Q as the operating current is not disrupted. The impedance estimation process based on benign current injection is decoupled from the operation of voltage and current controllers, which operate with positive sequence current on the inverters.

The impedance module 210 shown in FIG. 2, may be installed as a software add-on to any controller of a power converter, such as power converter 110 in FIG. 1. The computing environment within which embodiments of the disclosure may be implemented are now described with reference to FIG. 2.

The processor 225 may include one or more central processing units (CPUs), graphical processing units (GPUs), or any other processor known in the art. More generally, a processor as described herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 820 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor may be capable of supporting any of a variety of instruction sets. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

The system bus 206 may include at least one of a system bus, a memory bus, an address bus, or a message bus, and may permit exchange of information (e.g., data (including computer-executable code), signaling, etc.) between various components of the converter controller 205. The system bus 206 may include, without limitation, a memory bus or a memory controller, a peripheral bus, an accelerated graphics port, and so forth. The system bus 206 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnects (PCI) architecture, a PCI-Express architecture, a Personal Computer Memory Card International Association (PCMCIA) architecture, a Universal Serial Bus (USB) architecture, and so forth.

The converter controller 205 may also include a system memory 208 coupled to the system bus 206 for storing information and instructions to be executed by processor 225. The system memory 208 may include computer readable storage media in the form of volatile and/or nonvolatile memory, such as read only memory (ROM) and/or random access memory (RAM). The RAM may include other dynamic storage device(s) (e.g., dynamic RAM, static RAM, and synchronous DRAM). The ROM may include other static storage device(s) (e.g., programmable ROM, erasable PROM, and electrically erasable PROM). In addition, the system memory 208 may be used for storing temporary variables or other intermediate information during the execution of instructions by the processor 225. A basic input/output system (BIOS) containing the basic routines that help to transfer information between elements within converter controller 205, such as during start-up, may be stored in the ROM 831. RAM may contain data and/or program modules that are immediately accessible to and/or presently being operated on by the processor 225. System memory 208 may additionally include, for example, operating system, application programs, and other program modules.

The operating system may be loaded into the memory 208 and may provide an interface between other application software executing on the converter controller 205 and hardware resources of the converter controller 205. More specifically, the operating system may include a set of computer-executable instructions for managing hardware resources of the converter controller 205 and for providing common services to other application programs (e.g., managing memory allocation among various application programs). In certain example embodiments, the operating system may control execution of one or more of the program modules depicted as being stored in the data storage 227. The operating system may include any operating system now known or which may be developed in the future including, but not limited to, any server operating system, any mainframe operating system, or any other proprietary or non-proprietary operating system.

The converter controller 205 may perform a portion or all of the processing steps of embodiments of the invention in response to the processor 225 executing one or more sequences of one or more instructions contained in a memory, such as the system memory 208. Such instructions may be read into the system memory 208 from another computer readable medium, such as storage memory 227, which may contain one or more data stores and data files used by embodiments of the present invention. The data store may include, but are not limited to, databases (e.g., relational, object-oriented, etc.), file systems, flat files, distributed data stores in which data is stored on more than one node of a computer network, peer-to-peer network data stores, or the like. The processor 225 may also be employed in a multi-processing arrangement to execute the one or more sequences of instructions contained in system memory 208. In alternative embodiments, hard-wired circuitry may be used in place of or in combination with software instructions. Thus, embodiments are not limited to any specific combination of hardware circuitry and software.

As stated above, the converter controller 205 may include at least one computer readable medium or memory for holding instructions programmed according to embodiments of the invention and for containing data structures, tables, records, or other data described herein. The term "computer readable medium" as used herein refers to any medium that participates in providing instructions to the processor 225 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as a magnetic hard disk or removable media drive. Non-limiting examples of volatile media include dynamic memory, such as system memory 208. Non-limiting examples of transmission media include coaxial cables, copper wire, and fiber optics, including the wires that make up the system bus 206. Transmission media may also take the form of acoustic or light waves, such as those generated during radio wave and infrared data communications.

Computer readable medium instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the users computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, may be implemented by computer readable medium instructions.

The converter controller 205 may operate in a networked environment using logical connections to one or more remote computers. For example, remote computing devices may be a personal computer (laptop or desktop), a mobile device, a server, a router, a network PC, a peer device or other common network node, and typically includes many or all of the elements described above relative to converter controller 205. When used in a networking environment, converter controller 205 may include a modem for establishing communications over a network, such as the Internet. The modem may be connected to system bus 206 via a user network interface, or via another appropriate mechanism.

The networked environment may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between converter controller 205 and other computers. The network may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network.

It should be appreciated that the program modules, applications, computer-executable instructions, code, or the like depicted in FIG. 2 as being stored in the system memory 208 are merely illustrative and not exhaustive and that processing described as being supported by any particular module may alternatively be distributed across multiple modules or performed by a different module. In addition, various program module(s), script(s), plug-in(s), Application Programming Interface(s) (API(s)), or any other suitable computer-executable code hosted locally on the converter controller 205, a remote device, and/or hosted on other computing device(s) accessible via one or more of the network(s), may be provided to support functionality provided by the program modules, applications, or computer-executable code and/or additional or alternate functionality. Further, functionality may be modularized differently such that processing described as being supported collectively by the collection of program modules may be performed by a fewer or greater number of modules, or functionality described as being supported by any particular module may be supported, at least in part, by another module. In addition, program modules that support the functionality described herein may form part of one or more applications executable across any number of systems or devices in accordance with any suitable computing model such as, for example, a client-server model, a peer-to-peer model, and so forth. In addition, any of the functionality described as being supported by any of the program modules depicted in FIG. 2 may be implemented, at least partially, in hardware and/or firmware across any number of devices.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f), unless the element is expressly recited using the phrase "means for."

What is claimed is:

1. A system for estimation of grid impedance in a power converter controller, comprising:
    a processor for executing program modules of a system memory;
    the system memory having program modules comprising:
        a current controller configured to inject an injection current while operating online and coupled to a power grid at a point of common coupling (PCC), the injection current being benign to an operating current of the power converter;
        a voltage controller configured to regulate input voltage of the power converter; and
        an impedance module configured to:
            determine parameters for the injection current including injection interval and duration, current magnitude, current frequency, and symmetrical component;
            extract measurements of current and voltage at the PCC at an operating point shifted from a previous operating point in response to the injection current;
            extract symmetrical components of current and voltage measurements; and
            compute an estimated grid impedance based on the extracted symmetrical components.

2. The system of claim 1, wherein the symmetrical component is negative sequence.

3. The system of claim 1, wherein the symmetrical component of the injection current is positive sequence at N order harmonic of operating current frequency.

4. The system of claim 3, where N is an odd integer greater than 1.

5. The system of claim 1, wherein the symmetrical component of the injection current is negative sequence at N order harmonic of operating current frequency.

6. The system of claim 5, where N is an odd integer greater than 1.

7. The system of claim 1, wherein the impedance module sets the injection duration to less than one second.

8. The system of claim 1, wherein the impedance module sets the magnitude of injection current within a range between 5% and 15% of operating current.

9. The system of claim 1, further comprising an inverter for converting DC voltage to AC voltage using switching devices, wherein the impedance module is further configured to:
    pass the extracted symmetrical components through a series of low-pass filters and a notch filter to remove oscillations with twice the fundamental frequency.

10. A method for estimation of grid impedance in a power converter controller, comprising:
    injecting an injection current while operating online and coupled to a power grid at a point of common coupling (PCC), the injection current being benign to an operating current of the power converter;
    regulating input voltage of the power converter;
    determining parameters for the injection current including injection interval and duration, current magnitude, current frequency, and symmetrical component;
    extracting measurements of current and voltage at the PCC at an operating point shifted from a previous operating point in response to the injection current;
    extracting symmetrical components of current and voltage measurements; and
    computing an estimated grid impedance based on the extracted symmetrical components.

11. The method of claim 10, wherein the symmetrical component of the injection current is negative sequence.

12. The method of claim 10, wherein the symmetrical component of the injection current is at N order harmonic of operating current frequency, where N is an odd integer greater than 1.

13. The method of claim 10, wherein the injection duration is set to less than one second.

14. The method of claim 10, wherein the magnitude of injection current is set to within a range between 5% and 15% of operating current.

15. The method of claim 10, further comprising
    passing the extracted symmetrical components through a series of low-pass filters and a notch filter to remove oscillations with twice the fundamental frequency.

* * * * *